Figure 2A:
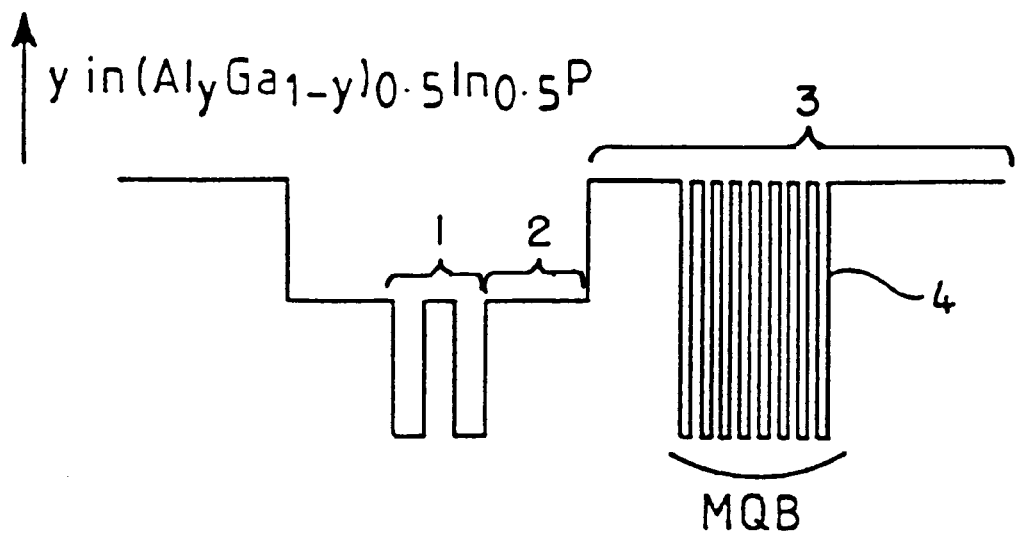

United States Patent
Duggan

[11] Patent Number: 5,991,321
[45] Date of Patent: Nov. 23, 1999

[54] SEPARATE CONFINEMENT HETEROSTRUCTURE LASER DEVICE

[75] Inventor: Geoffrey Duggan, Deddington, United Kingdom

[73] Assignee: Sharp Kabushiki Kaisha, Osaka, Japan

[21] Appl. No.: 08/991,236

[22] Filed: Dec. 16, 1997

[30] Foreign Application Priority Data

Dec. 21, 1996 [GB] United Kingdom ............... 9626644

[51] Int. Cl.$^6$ ............................................. H01S 3/19
[52] U.S. Cl. ................................. 372/45; 372/46
[58] Field of Search ............................ 372/45, 46, 47, 372/48

[56] References Cited

U.S. PATENT DOCUMENTS

| | | | |
|---|---|---|---|
| 5,251,224 | 10/1993 | Irikawa et al. ............................ | 372/45 |
| 5,386,429 | 1/1995 | Naito et al. ................................ | 372/46 |
| 5,425,041 | 6/1995 | Seko et al. ................................. | 372/45 |
| 5,502,739 | 3/1996 | Kidoguchi et al. ........................ | 372/45 |
| 5,509,024 | 4/1996 | Bour et al. ................................. | 372/45 |
| 5,544,187 | 8/1996 | Kadoiwa et al. .......................... | 372/45 |
| 5,600,667 | 2/1997 | Kidoguchi et al. ........................ | 372/45 |
| 5,737,350 | 4/1998 | Motoda et al. ............................ | 372/45 |

FOREIGN PATENT DOCUMENTS

| | | |
|---|---|---|
| 0506049 | 9/1992 | European Pat. Off. . |
| 0715380 | 6/1996 | European Pat. Off. . |
| 0784361 | 7/1997 | European Pat. Off. . |
| 2308732 | 7/1997 | United Kingdom . |

OTHER PUBLICATIONS

K. Iga, et al., "Electron Reflectance of Multiquantum Barrier (MQB)" Electronics Letters, vol. 22, No. 19, pp. 1008–1010, Sep. 11, 1986.

K. Kishino, et al., "Enhanced carrier confinement effect by the multiquantum barrier in 660 nm GaInP/AlInP visible lasers" Applied Physics Letter, vol. 58, No. 17, pp. 1822–1824, Apr. 29, 1991.

H. Hamada, et al., "Room–emperature CW operation of 610nm Band AlGaInP Strained Multiquantum well laser diodes with multiquantum barrier" Electronics Letters, vol. 28, No. 19, pp. 1834–1836, Sep. 10, 1992.

D. P. Bour, et al., "Strained $Ga_xIn_{1-x}P/(AlGa)_{0.5}In_{0.5}P$ Heterostructures and Quantum–Well Laser Diodes" IEEE Journal of Quantum Electronics, vol. 30, No. 2, pp. 593–606, 1994.

P. M. Smowton, et al., "Threshold current temperature dependence of $GaInP/(Al_yGa_{1-y})InP$ 670 mm quantum well lasers" Applied Physics Letter, vol. 67, No. 9, pp. 1265–1267, Aug. 28, 1995.

British Search Report dated Mar. 12, 1997, for British Patent Application No. GB9626644.0.

*Primary Examiner*—Hung N. Ngo

[57] ABSTRACT

A separate confinement heterostructure laser device has an optical guiding region, an active region in the optical guiding region, and p-type and n-type cladding regions on opposite sides of the optical guiding region. At least one barrier layer is present within the p-type cladding region. The composition of the barrier layer is such that it has an X-minimum higher than that of adjacent parts of the p-type cladding region. The composition and/or thickness of the barrier layer is also such that it has a Γ-minimum which is higher than the X-minima of the adjacent parts of the p-type, cladding region. The thickness of the barrier layer is such as to prevent electron tunneling between the X-bands of the adjacent parts of the p-type cladding region on opposite sides of the barrier layer, and/or the compositions of the adjacent parts of the p-type cladding region on opposite sides of the barrier layer are sufficiently different from one another to prevent such tunneling.

28 Claims, 15 Drawing Sheets

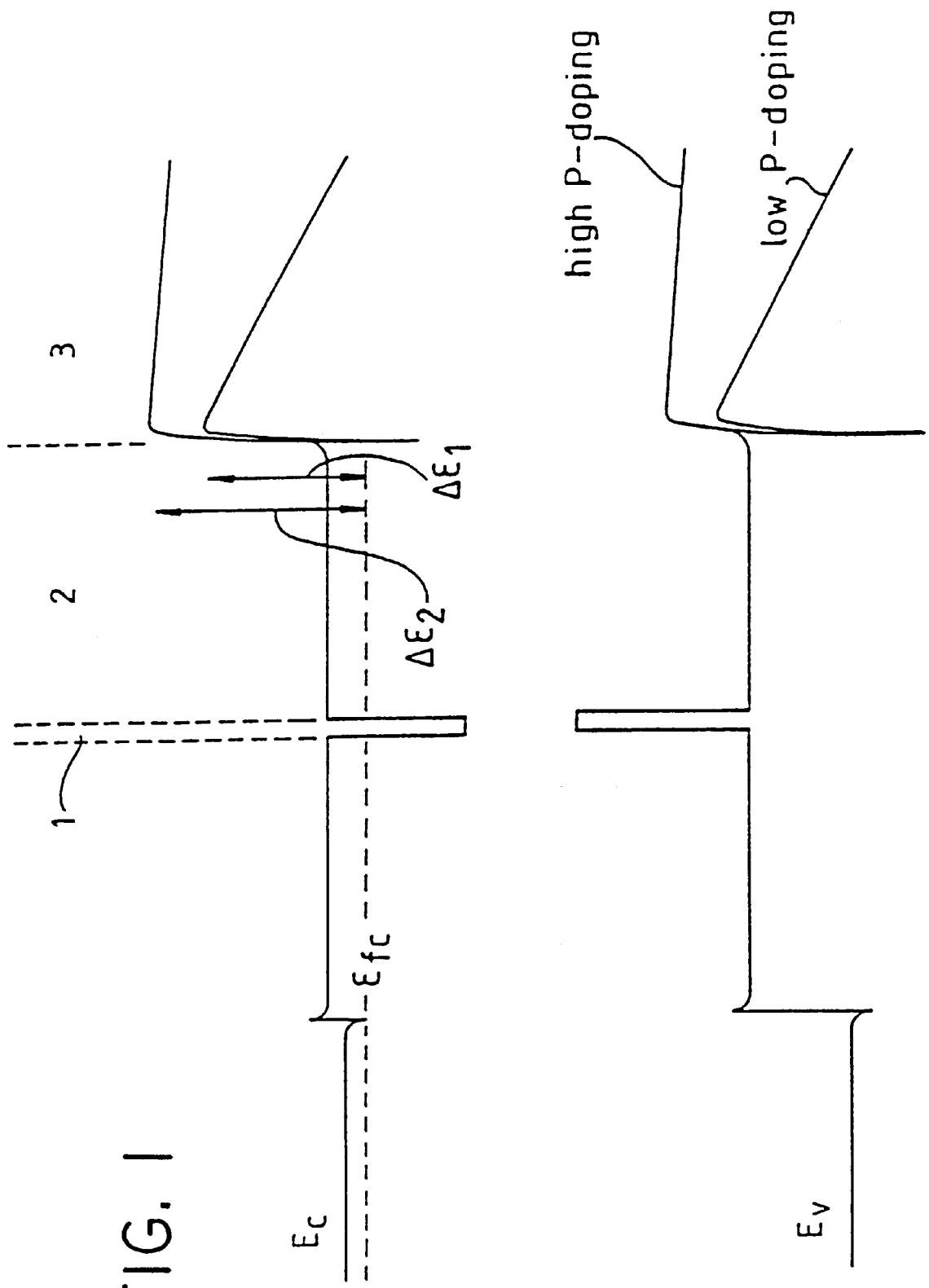

Relative positions of the band-edges in a GaAs-(AlGa)As Heterostructure.

SEPARATE CONFINEMENT HETEROSTRUCTURE LASER DEVICE

This invention relates to a semiconductor laser device and particularly, but not exclusively, to a semiconductor laser device which emits visible radiation in the wavelength range 630 nm to 680 nm. The laser device may be of the edge-emitting or of the surface emitting type.

Laser devices or laser diodes (LDs) fabricated in the (InGa)P/(AlGaIn)P materials systems which emit visible light in the 630 nm–680 nm wavelength range are becoming increasingly important components of professional and consumer products. For example, it is envisaged that the Digital Video Disk (DVD) system will employ a 635 nm–650 nm wavelength LD capable of delivering 5 mW output power up to a temperature of 60° C. The next generation of semiconductor lasers will need an even greater maximum power output up to the same or higher (eg 70° C.) operating temperature.

A principal limitation of current laser diodes is that they are incapable of operating for long periods (or with a sufficiently low threshold current) at the highest specified operating temperature. It is generally believed that this is caused by electron leakage from the active region of the device into the surrounding optical guiding region and subsequently into the p-type cladding region.

So far, two methods have been employed to try and reduce this carrier leakage, namely (1) increasing the p-type doping in the cladding region, as disclosed by D. P. Bour et al in IEEE Journal of Quantum Electronics" Vol 30, pages 593–606 (1994), and
(2) using a Multiquantum Well Barrier (MQB) in the p-type cladding region, as disclosed by Bour et al (supra) and K. Iga et al in Electronics Letters, Sep. 11, 1986, vol. 22, No. 19, pages 1008 to 1010.

Both of these solutions are non-ideal and an alternative scheme based on the use of a δ-doped p-type layer inserted in the cladding region has been proposed in our copending British Patent Application No. 9526631.8 filed on Dec. 29, 1995.

The physical principle behind case (1) above can be understood by reference to accompanying FIG. 1 which shows an active region 1, an optical guiding region 2 and a p-type cladding region, 3 of a single quantum well (SQW) LD under operating conditions. The electron leakage current consists of that fraction of the electrons which have sufficient thermal energy to surmount the potential barrier on the right hand side of the diagram. The doping level of the p-type cladding layer can be increased so as to increase the barrier height from $\Delta\epsilon_1$ to $\Delta\epsilon_2$. However, there are practical limitations to the amount of p-doping which can be incorporated into (AlGain)P or (AlIn)P cladding regions. This is particularly true of MOCVD grown materials where a maximum impurity concentration of approximately $2\times10^{18}$ cm$^{-3}$ can be achieved using either Zn or Mg. An example of this is given by D. P. Eour et al (supra). However, any further increase in dopant concentration using this technique causes the dopant to diffuse into the active region 1 of the device, thereby degrading its performance.

Figure 2B:
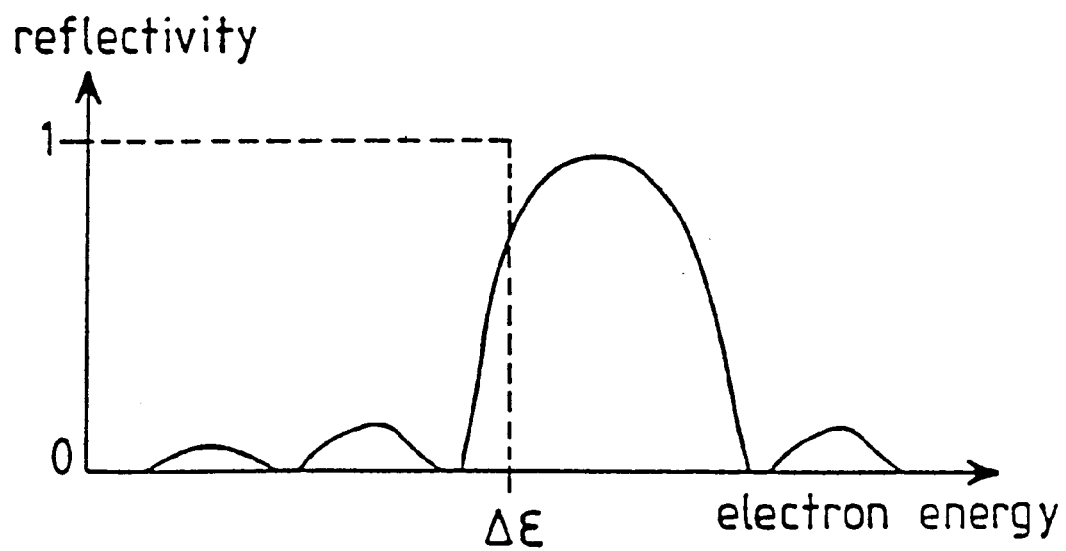

The principle of operation in case (2) above, namely the MQB is illustrated in FIGS. 2(a) and 2(b). FIG. 2(a) shows the conduction band energy of a SCH laser structure incorporating an MQB 4 in the p-type cladding region 3. The MQB consists of very thin (a few monolayers thick) alternating layers of, for example, (InGa)P and (AlGain)P. An electron which has sufficient thermal energy to escape from the SCH structure will be quantum mechanically reflected at each of the interfaces of the MQB. If the layer thicknesses are chosen to be $\lambda/4$ in thickness, where $\lambda$ is the electron wavelength, then a band of energies can be engineered at which electrons will be reflected with unity probability. This is indicated in FIG. 2(b) where almost unity reflectivity of the electron can be seen to exist well above the classical barrier height $\Delta\epsilon$. In FIG. 2(b), the broken and full lines respectively represent the classical reflectivity and the quantum mechanical calculation of the reflectivity.

Conceptually, then the MQW is analogous to a DBR (distributed Bragg reflector) for an optical wave. K. Kishino et al, Appl. Phy. Lett, vol. 58, pages 1822–1824, (1991) and H. Hamada et al, Electron. Lett., vol. 28, pages 1834–1836, (1992) provide evidence to show that the temperature dependence of the threshold current of short wavelength lasers is improved through the use of such reflectors. However, the effectiveness of the reflectors is usually inferred from LD operating characteristics rather than from a direct measurement of the enhancement of the barrier height. It is difficult to quantify, therefore, just what advantage has accrued from the use of MQB in comparison to any advantage that might have occurred simply due to better processing or better material quality. Finally, it should be noted that the effectiveness of the MQB is only realised if the coherence length of the electron is long. Anything which destroys this coherence, e.g. interface scattering, will diminish the reflectivity properties significantly.

In British Patent Application No. 9526631.8 (supra), it is proposed that the insertion of a δ-doped p-type layer in the p-cladding region of a separate confinement heterostructure (SCI I) laser diode will have the effect of increasing the band bending on the p-side of the heterojunction and thus increase the barrier which is present to electron thermal leakage.

P. M. Smowton et al in Appl. Phys. Lett., vol. 67, pages 1265–1267, 1995 show that an important leakage mechanism for electrons can be via the indirect X-valley of the conduction bands in the p-side guiding and cladding regions of a separate confinement heterostructure (SCH) laser having two $Ga_{0.41}In_{0.59}P$ quantum wells separated by a barrier, all set in an optical guiding region of $(Al_yGa_{1-y})_{0.51}In_{0.49}P$ (where y is variously 0.3, 0.4 and 0.5), and clad with $(Al_{0.7}Ga_{0.3})_{0.51}In_{0.49}P$ cladding layers doped with Zn on the p-side and Si on the n-side. However, no proposals are made for mitigating the problem, caused by loss of electrons via this mechanism.

Figure 3:
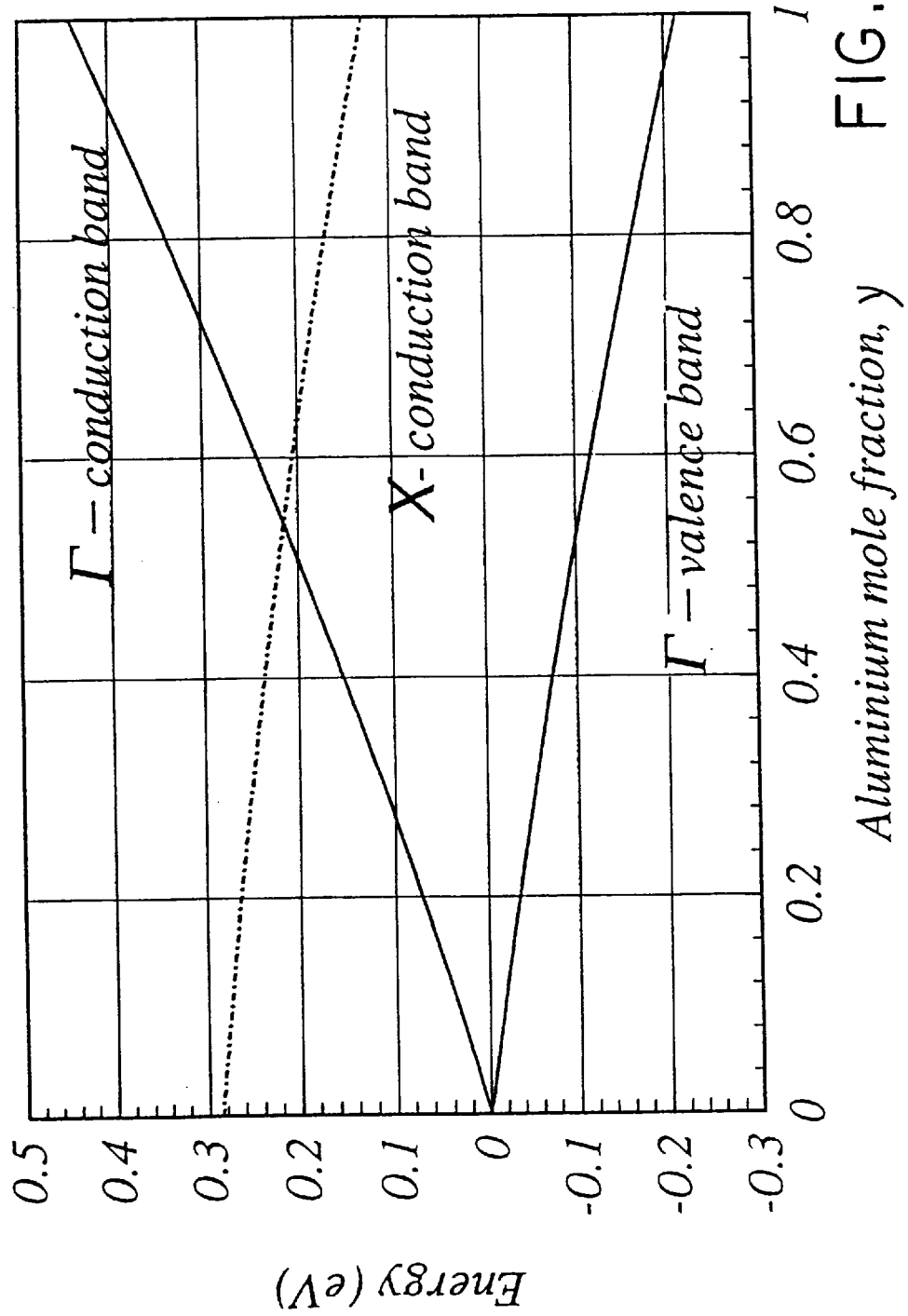
Figure 4:
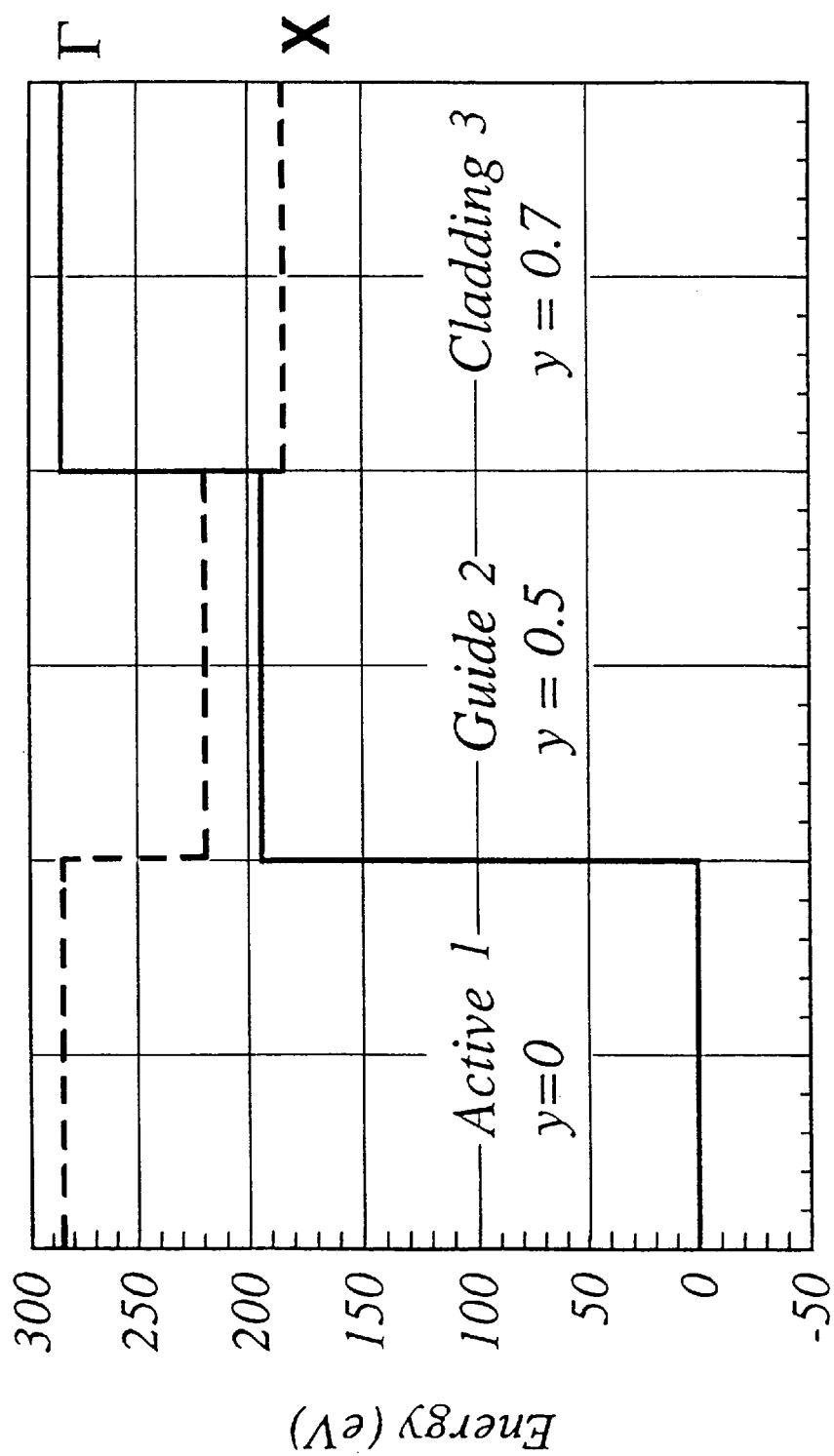

Referring now to FIGS. 3 and 4, the importance of the above discussed electron leakage mechanism via the X-bands in the guiding and cladding region, can be seen. FIG. 3 shows the relative positions of the conduction and valence band edges, at the Γ-point in the Brillouin zone, and X-minima for the alloy system $(Al_yGa_{1-y})_{0.515}In_{0.485}P$, where y is between 0 and 1, which is lattice matched to GaAs. It is this materials system from which SCH LDs are formed for visible emitters. In order to construct FIG. 3, it has been assumed that the conduction band discontinuity is a constant and equal to 67% of the total band gap difference. Typically, optical guiding region 2 would be formed using the alloy with y=0.5 and p-type cladding region 3 would be formed using the alloy with y=0.7. Active region 1 of the LD is formed from a quantum well (QW) of the alloy (GaIn)P.

FIG. 4 shows the, band edge alignment in a typical laser structure. It is to be noted that the alignment for the X-band edge is such that the X-minimum in the p-type cladding region 3 is lower than that in the guiding region 2. This has the implication that some of the electrons which are thermally excited from the well (or guiding region) surmount the barrier presented by the X-minimum in the guiding region 2.

From here, the electrons transfer to the lower energy X-band in the p-type cladding region where they are free to diffuse away from the active region 1.

Figure 5:
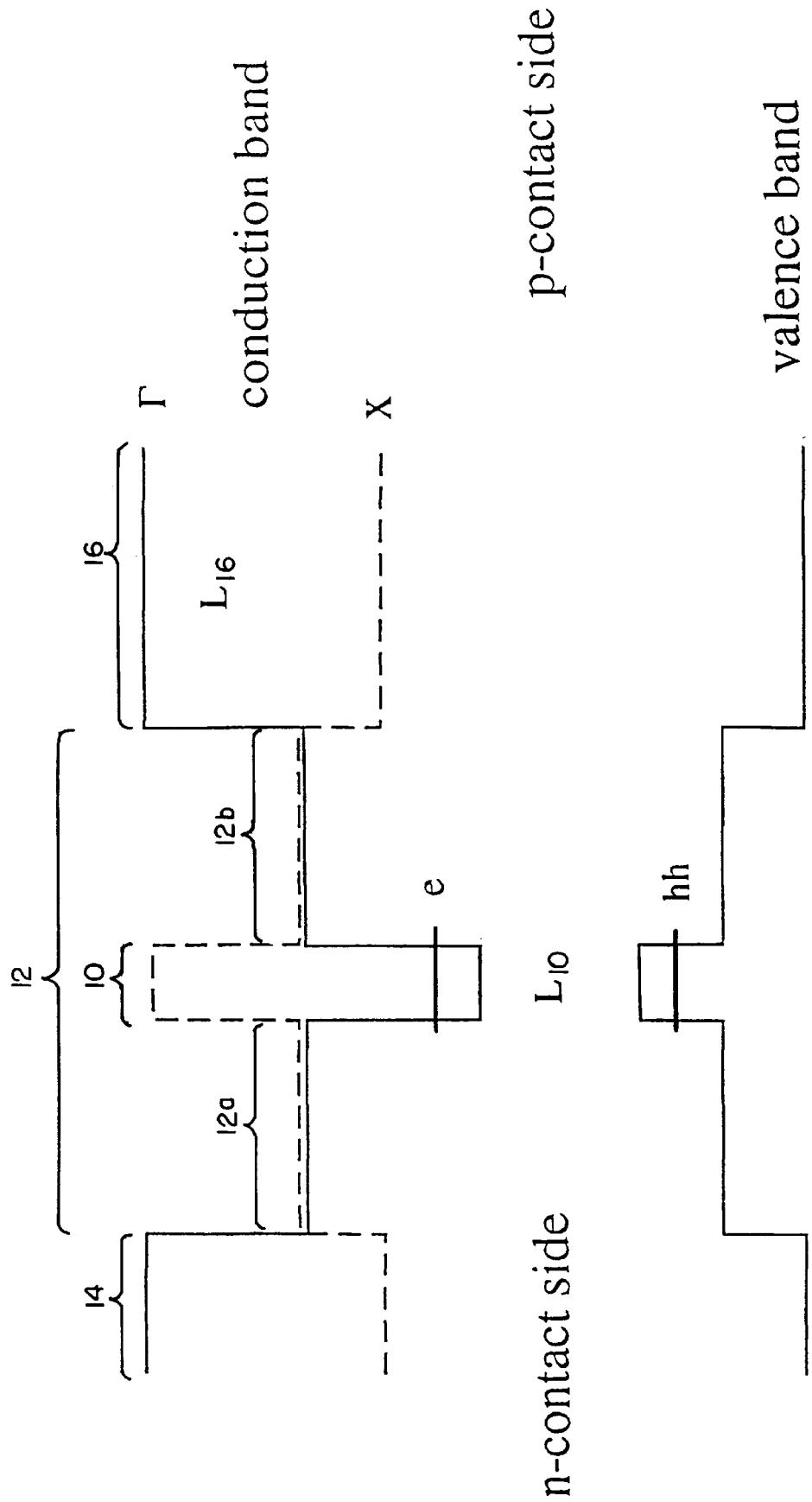

In FIG. 5, active region 10 set in optical guiding region 12 composed of n-side and p-side guiding regions 12a and 12b, respectively, and n-type and p-type cladding regions 14 and 16 of a laser diode are schematically illustrated. Under normal operating conditions, electrons are injected from the n-contact side of the device whilst holes are injected from the p-contact side of the device. These electrons and holes (generically referred to as "carriers") recombine in the active region 10 of the device producing photons of the appropriate energy. There may be a single quantum well (SQW) or a multiplicity of wells (MQW) in the active region 10. The QW thickness $L_{10}$ is adjusted so that the confined electron energy level (e) and heavy-hole (hh) are such that their energetic separation will produce photons of the appropriate energy. $L_{16}$ indicates the thickness of the p-type cladding region 16. The optical wave is guided by the refractive index difference that exists principally between the optical guiding region 12 of the device and the wider bandgap cladding regions 14 and 16. Note that the X-minimum in the p-type cladding region 16 is below that in the p-side guiding region 12b. This means that any electrons which are thermally excited to the X-band of the guiding region 12b will thermalise down to the X-band in the p-type cladding region 16 where they will be free either to recombine (a loss) or to drift and diffuse away from the active QW region 10 (a further loss).

It is an object of the present invention to mitigate the problem of thermally activated loss of electrons.

According to the present invention, there is provided a separate confinement heterostructure laser device comprising:

an optical guiding region;

an active region in said optical guiding region; and n- and p-type cladding regions on opposite sides of said optical guiding region;

characterised in that an electron-reflecting barrier layer is provided in a p-side region of the device; in that:

(a) the composition of said electron-reflecting barrier layer is such that it has an X-minimum which is higher than that in an adjacent part of the p-side region at least on that side of the barrier layer which is disposed between the barrier layer and said active region, and (b) the thickness of said barrier layer is such as to prevent electron tunnelling between the X-bands of the adjacent parts of the p-side region on opposite sides of said barrier layer, and/or parts of the p-side region on opposite sides of said barrier layer have compositions which are sufficiently different from one another to prevent such tunnelling.

The barrier layer may be provided in the p-type cladding region. In such case, preferably (a) the composition of said electron-reflecting barrier layer is such that the X-minimum therein is higher than that in an adjacent part of the p type cladding region at least on that side of the barrier layer which is disposed between the barrier layer and said optical guiding region; (b) the composition and/or thickness of said barrier layer is such that it has a Γ-minimum which is higher than the X-minimum of said adjacent part of the p-type cladding region; and (c) the thickness of said barrier layer is such as to prevent electron tunnelling between the X-bands of the adjacent parts of said p-type cladding region on opposite sides of the barrier layer, and/or the adjacent parts of said p-type cladding region on opposite sides of the barrier layer have compositions which are sufficiently different from one another to prevent such tunnelling.

More preferably, (a) the composition of said barrier layer is such that the X-minimum therein is higher than that of adjacent parts of the p-type cladding region on opposite sides of the barrier layer; (b) the composition and/or thickness of said barrier layer is such that the Γ-minimum therein is higher than the X-minima of adjacent parts of the p-type cladding region on opposite sides of the barrier layer; and (c) the thickness of said barrier layer is such as to prevent electron tunnelling between the X-bands of said adjacent parts of said p-type cladding region, and/or the adjacent parts of said p-type cladding region on opposite sides of the barrier layer have compositions which are sufficiently different from one another to prevent such tunnelling.

The terms Γ-band and X-band as used herein refer to symmetry points in the Brillouin zone and are standard terms in solid state physics, see for example R. A. Smith, "Semiconductors", (Cambridge University Press, 1978). The terms Γ-minimum and X-minimum refer to the minimum energy level of the Γ-band and the X-band, respectively.

The barrier layer preferably has substantially the same composition as that of the active region.

The effect of said barrier layer in the laser device according to the present invention is to act as a barrier to electrons travelling in the X-valley (i.e. relatively lower energy level X-electrons) and thus reflect them back towards the active region and prevent their drift and diffusion in the p-type cladding region. It is considered possible to block some of the electron leakage using just a single barrier layer, thus making it easier to implement than the above-mentioned MQB which, in contrast to the single layer, relies on quantum mechanical coherence of the states for its reflecting power.

The thickness of the barrier layer is most preferably chosen such that the Γ-minimum therein defined by a first confined electron state (e') in the barrier layer lies above that of the X-minima in the adjacent cladding and guiding regions. With e' in this energy position, there is no state of lower energy into which electrons could thermalise and subsequently recombine. Typically, the thickness of the barrier layer is 20 Å to 3 Å, and is preferably 15 Å to 7 Å.

Preferably, the thickness of that part of the p-type cladding region which is disposed between the barrier layer and the optical guiding region is not less than 100 Å, and more preferably is in the range of 100 Å, to 1 μm. This assists in minimising (1) thermal escape of carriers from the cladding region over the barrier provided by the barrier layer, and (2) tunnelling of carriers through the barrier layer. This is because, if the carriers in this part of the cladding region have thermalised to the bottom of the X-band, they will have the maximum barrier to surmount and the maximum barrier to tunnel through.

In another embodiment, at least one additional barrier layer is provided. Preferably, the thicknesses of the barrier and said at least one additional barrier layers decrease away from the guiding region. This provides a plurality of e' levels which rise into the p-type cladding region from the guiding region so as to provide an increasing tunnel barrier to electrons. In another series of embodiments, the electron-reflecting barrier layer and/or at least one additional electron-reflecting barrier layer is provided in the p-side optical guiding region. In such embodiments, the thickness of said barrier layer is preferably such that it has a first confined electron energy level which is higher than the X-minimum of an adjacent part of the p-type cladding region. Such barrier layer preferably also has a composition such that the X-minimum therein is higher than that in the p-type cladding region.

The separation between adjacent barrier layers is preferably not less than 2.85 Å and is preferably 7 Å to 15 Å. The material separating adjacent barrier layers preferably has substantially the same composition as that of the p-type cladding region.

The present invention is applicable, for example, to separate confinement heterostructure laser devices based on the alloy system (i) (InGa)P/(AlGaIn)P or on the alloy system (ii) GaAs/(AlGa)As.

The alloy system (i) is preferably the alloy system:

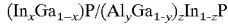

$(In_xGa_{1-x})P/(Al_yGa_{1-y})_zIn_{1-z}P$ where $0.3 \leq x \leq 0.6$, y is in the range 0 to 1, and z is in the range of 0.3 to 0.6. Preferably, z in the alloy system (i) is 0.515 because this is the composition at which it is lattice-matched with a GaAs substrate.

The alloy system (ii) is preferably GaAs/(Al$_x$Ga$_{1-x}$)As where x is in the range of 0.1 to 1.

It is to be appreciated that the values of x and y in the alloy systems (i) and (ii) above depend upon the composition of the parts of the p-side region which are adjacent to the electron-reflecting barrier layer.

In all of the above embodiments, it is within the scope of the present invention for the laser diode to be of the Graded Refractive Index Separate Confinement Heterostructure (GRINSCH) type.

The LD may be of the edge-emitting or of the surface emitting type.

Figure 6:
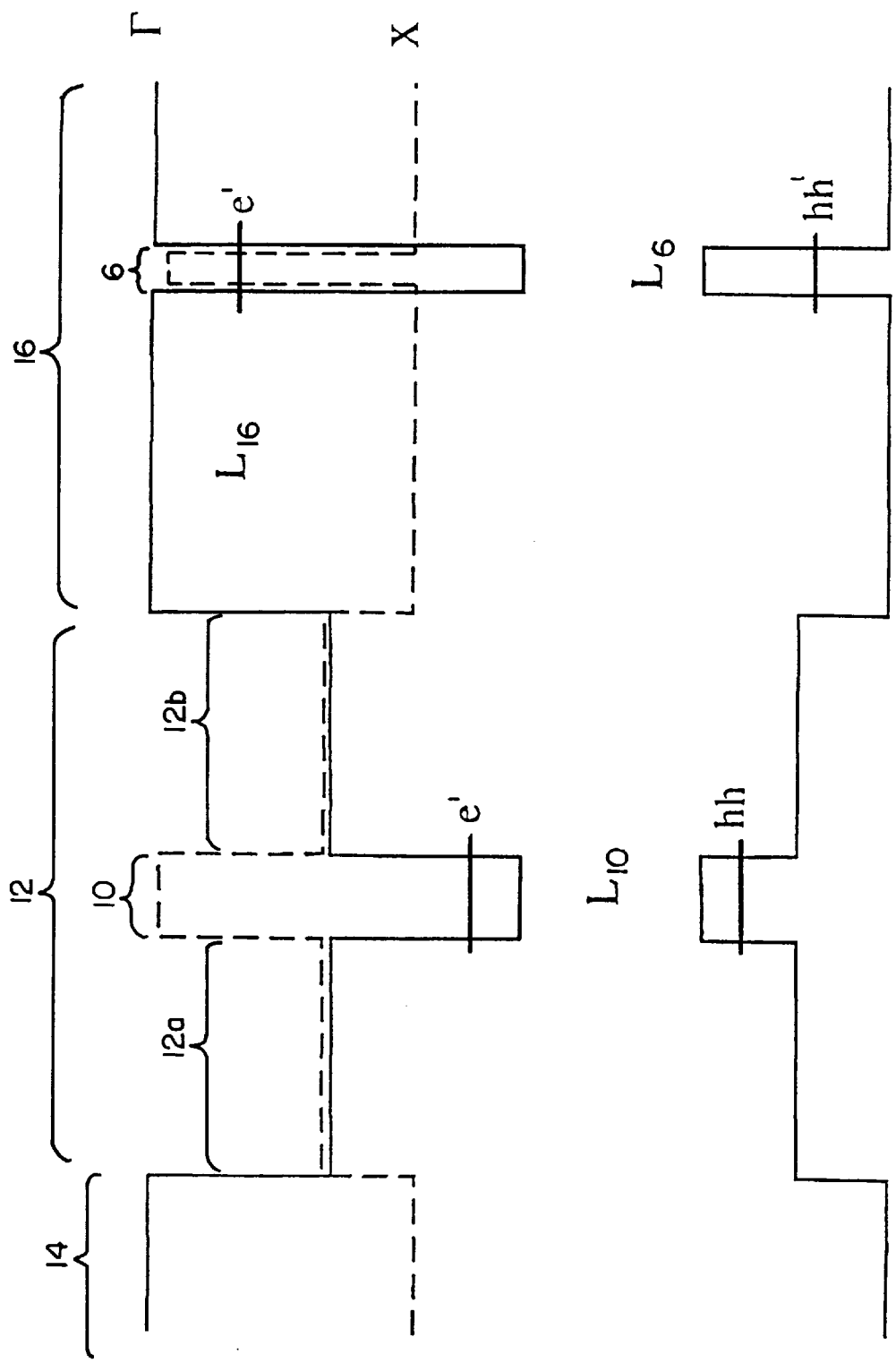
Figure 7:
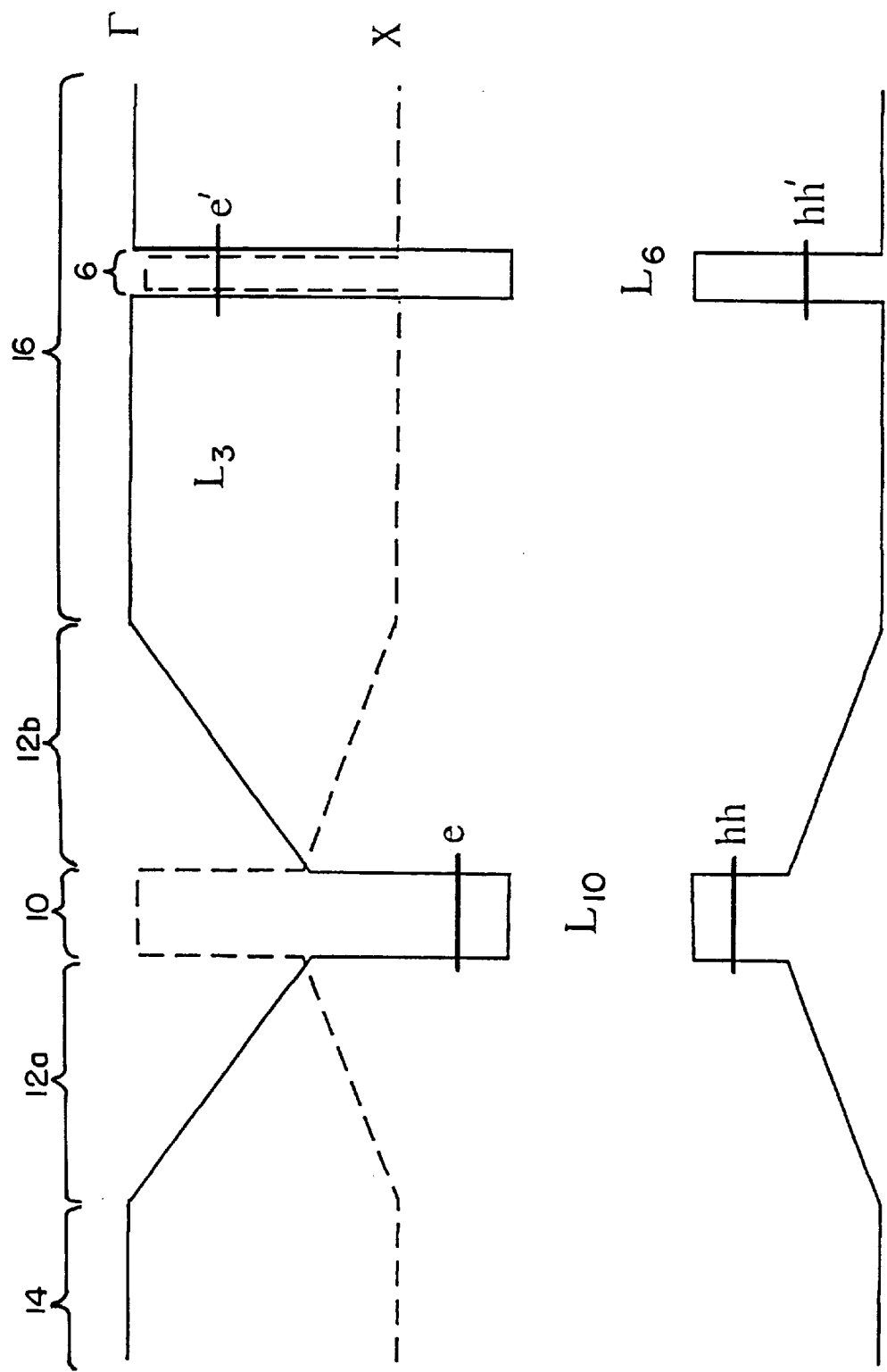
Figure 8:
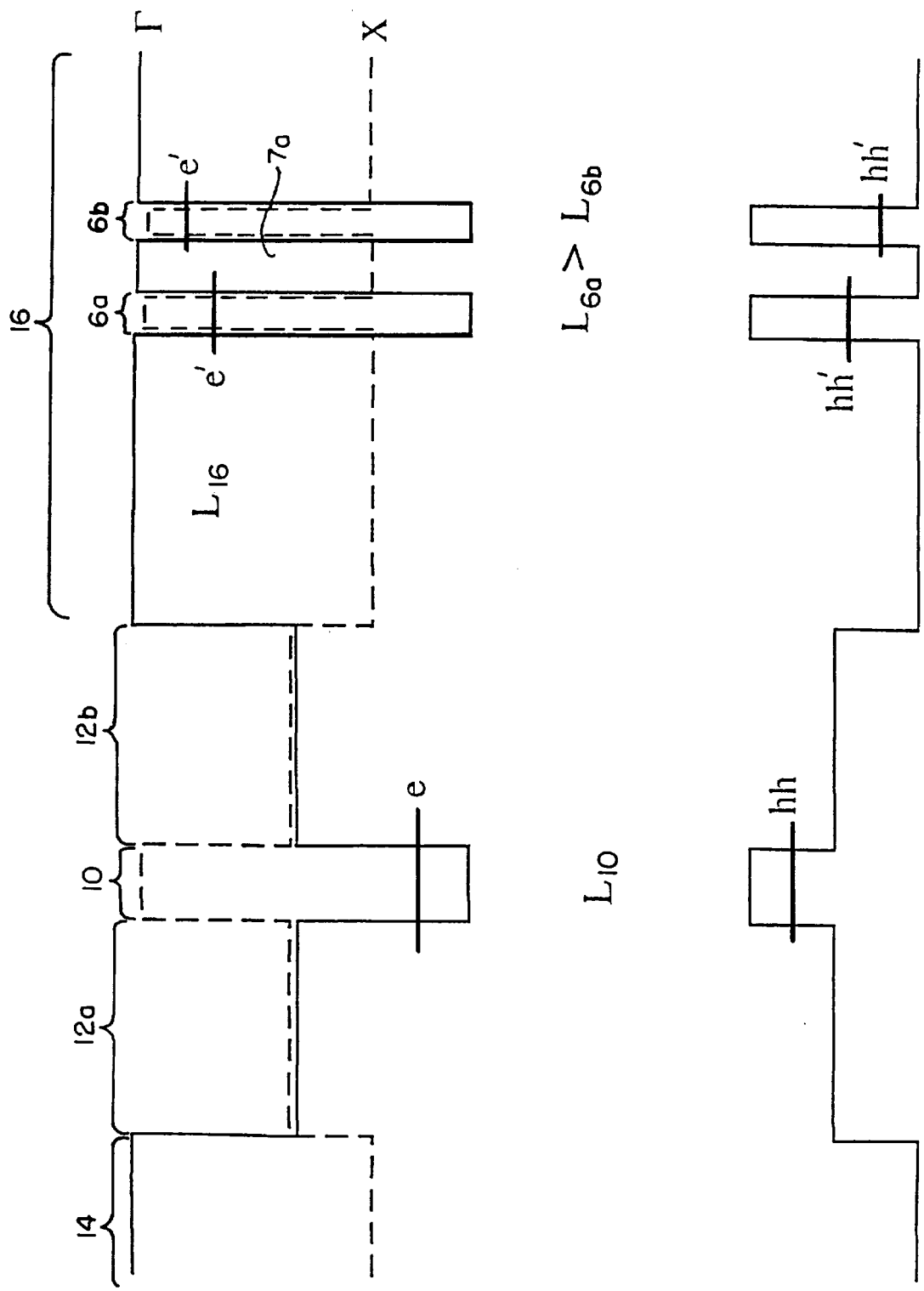
Figure 9:
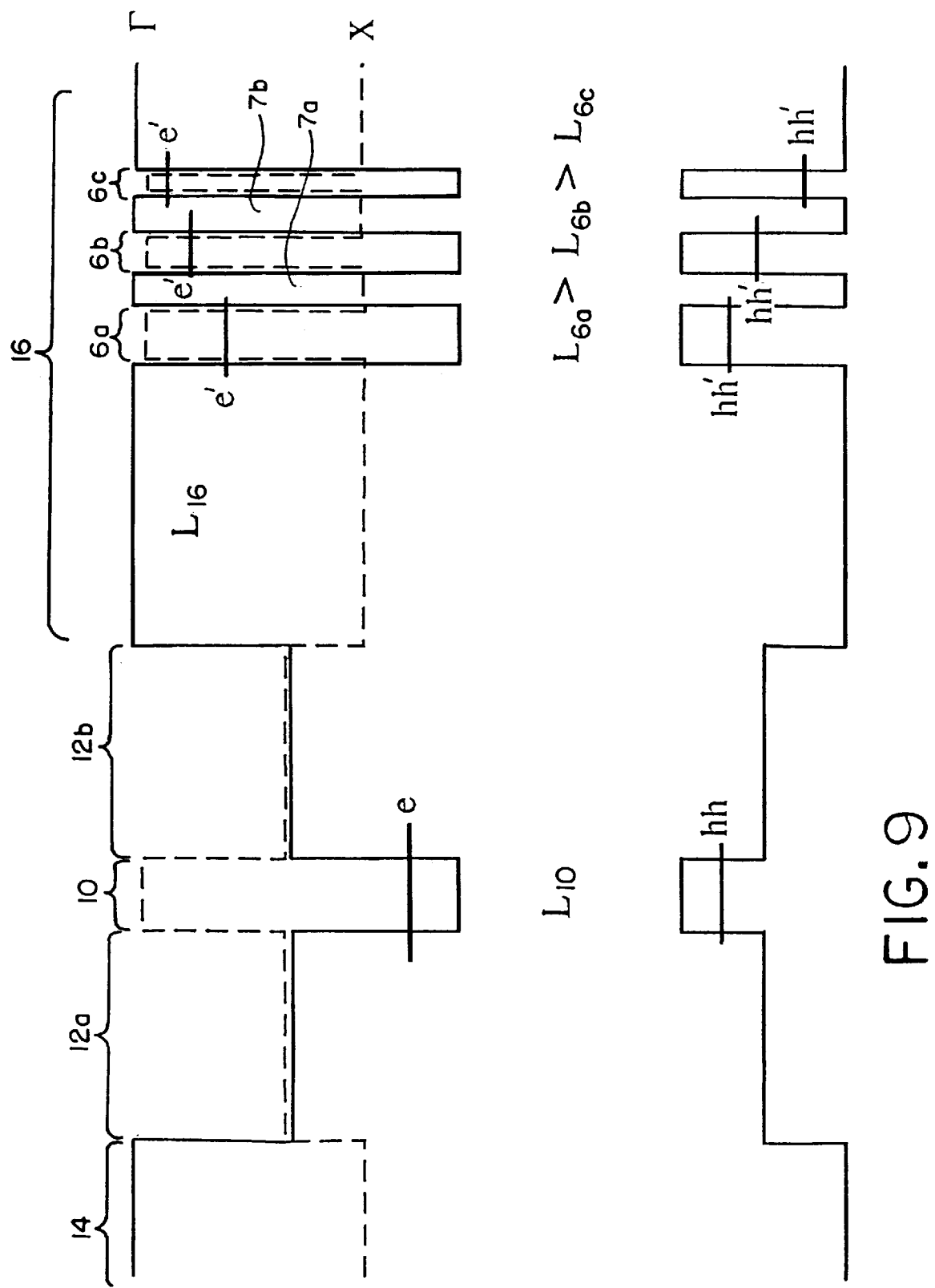
Figure 10:
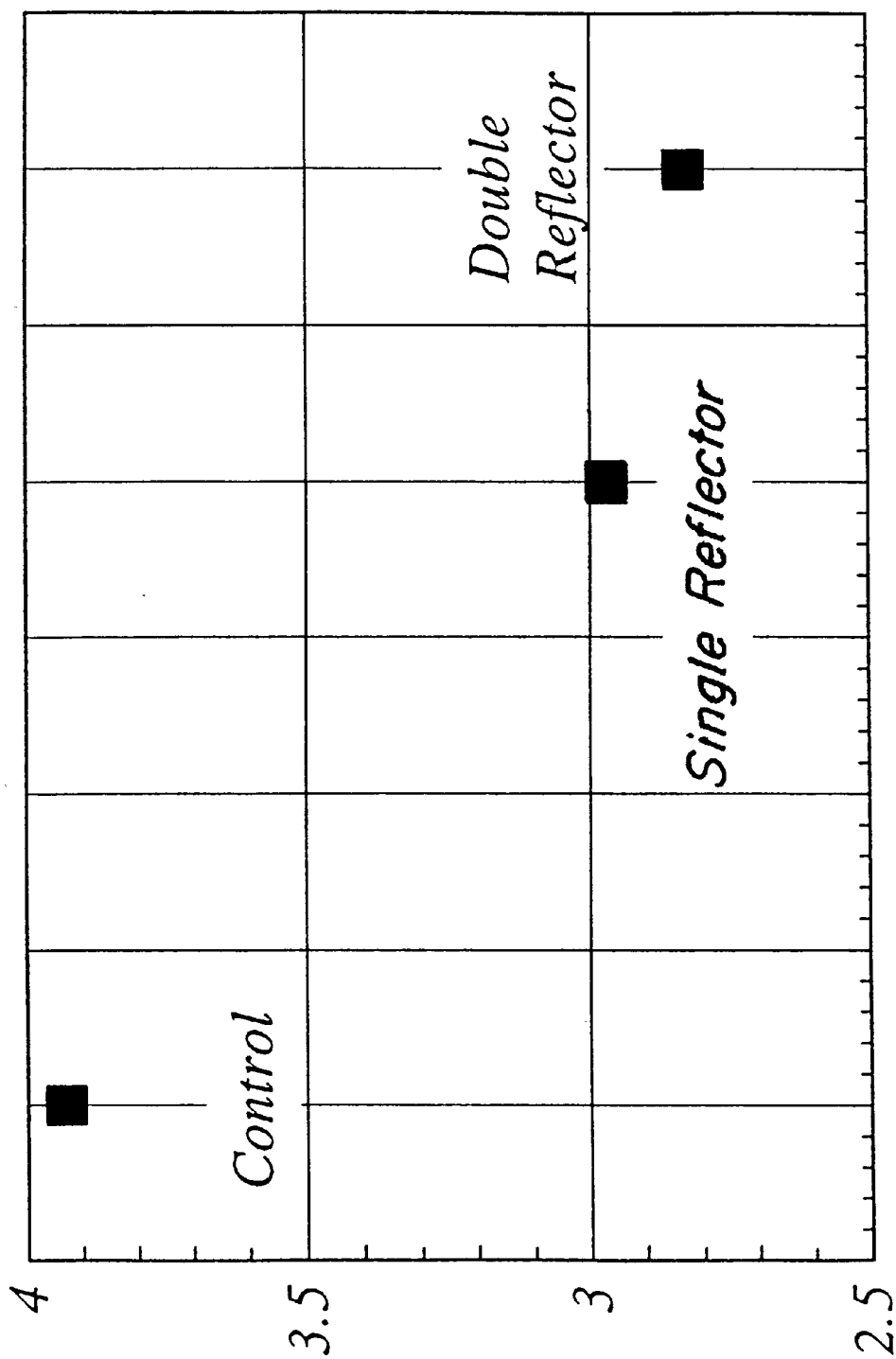
Figure 11:
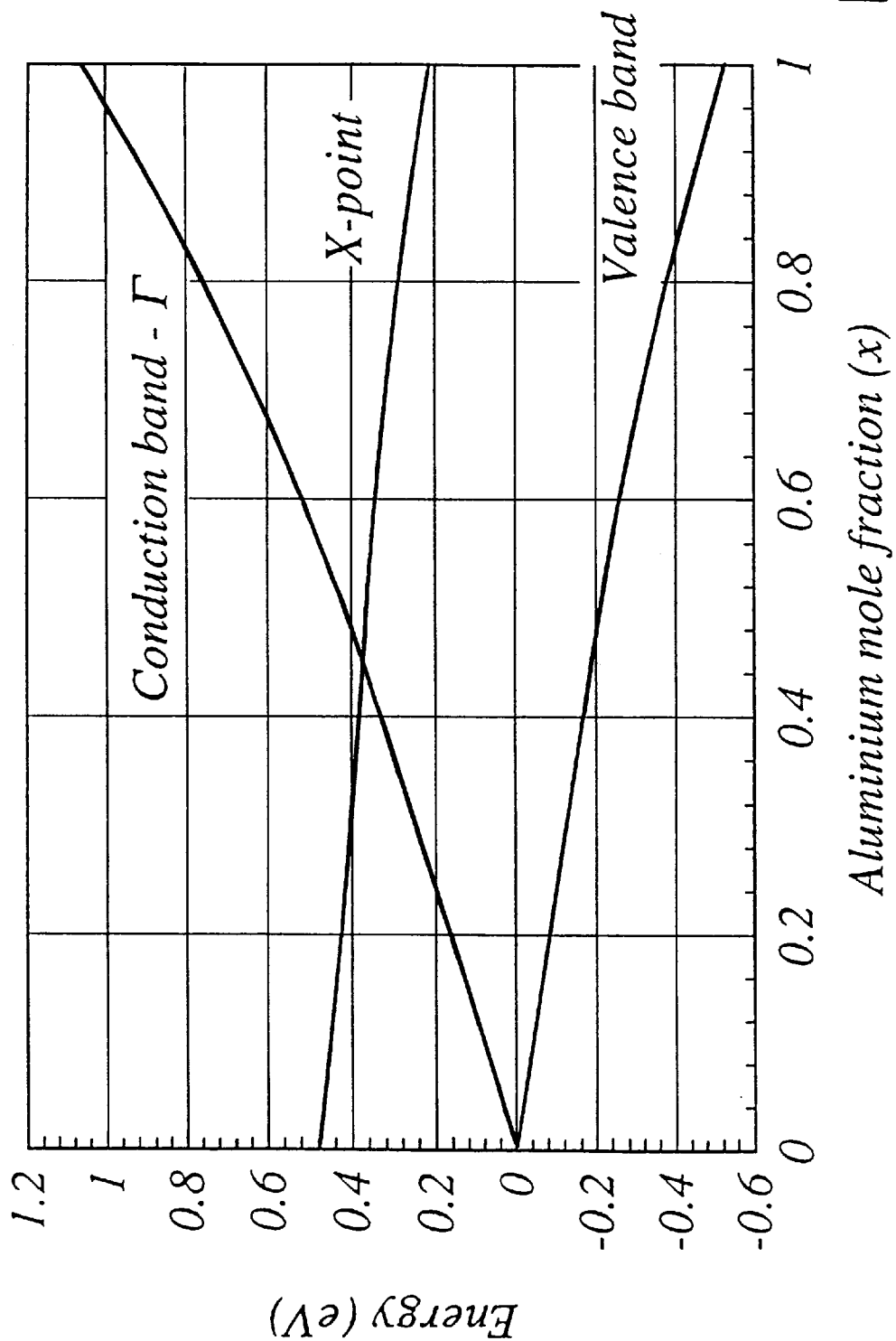
Figure 12:
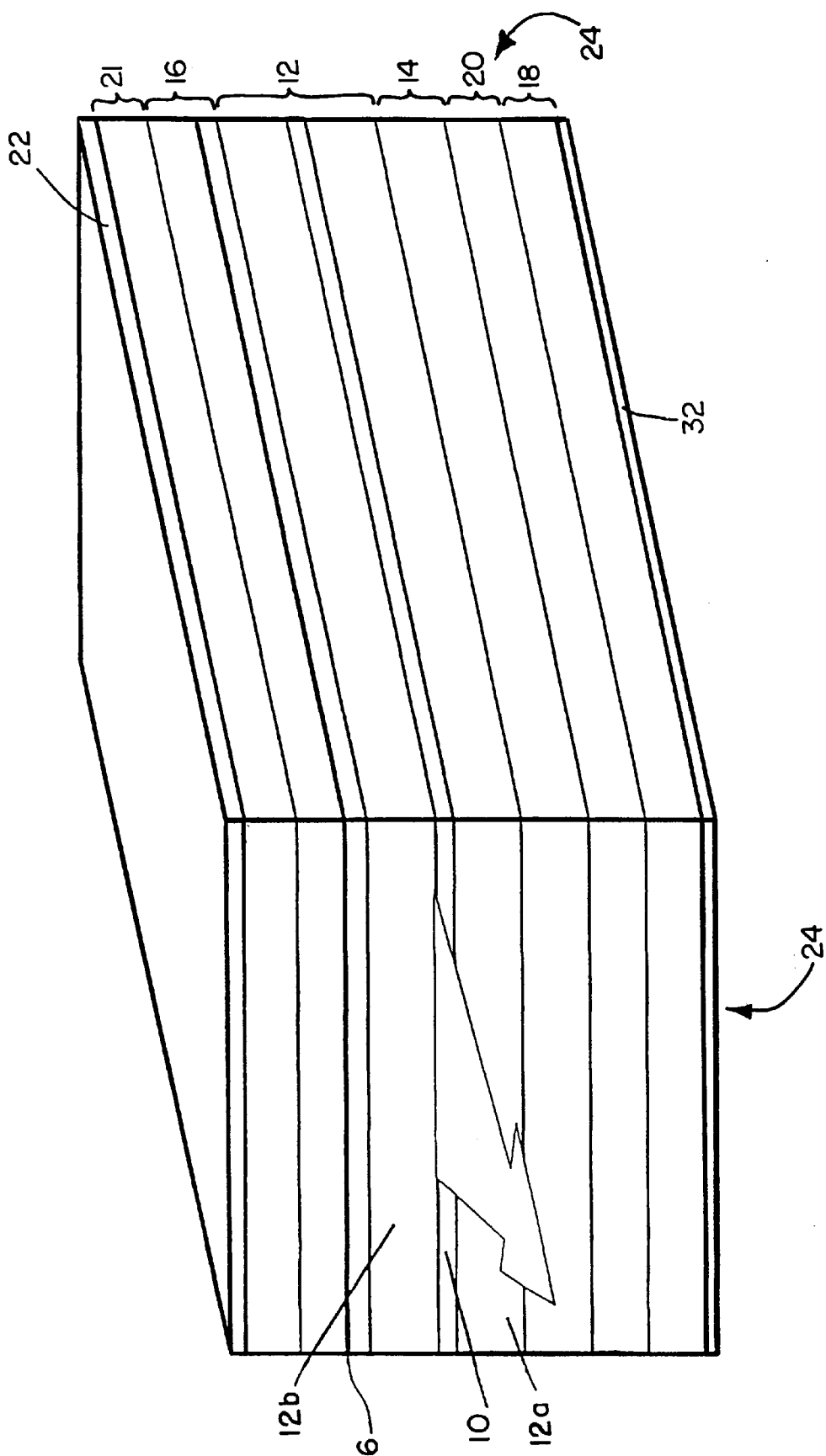
Figure 13:
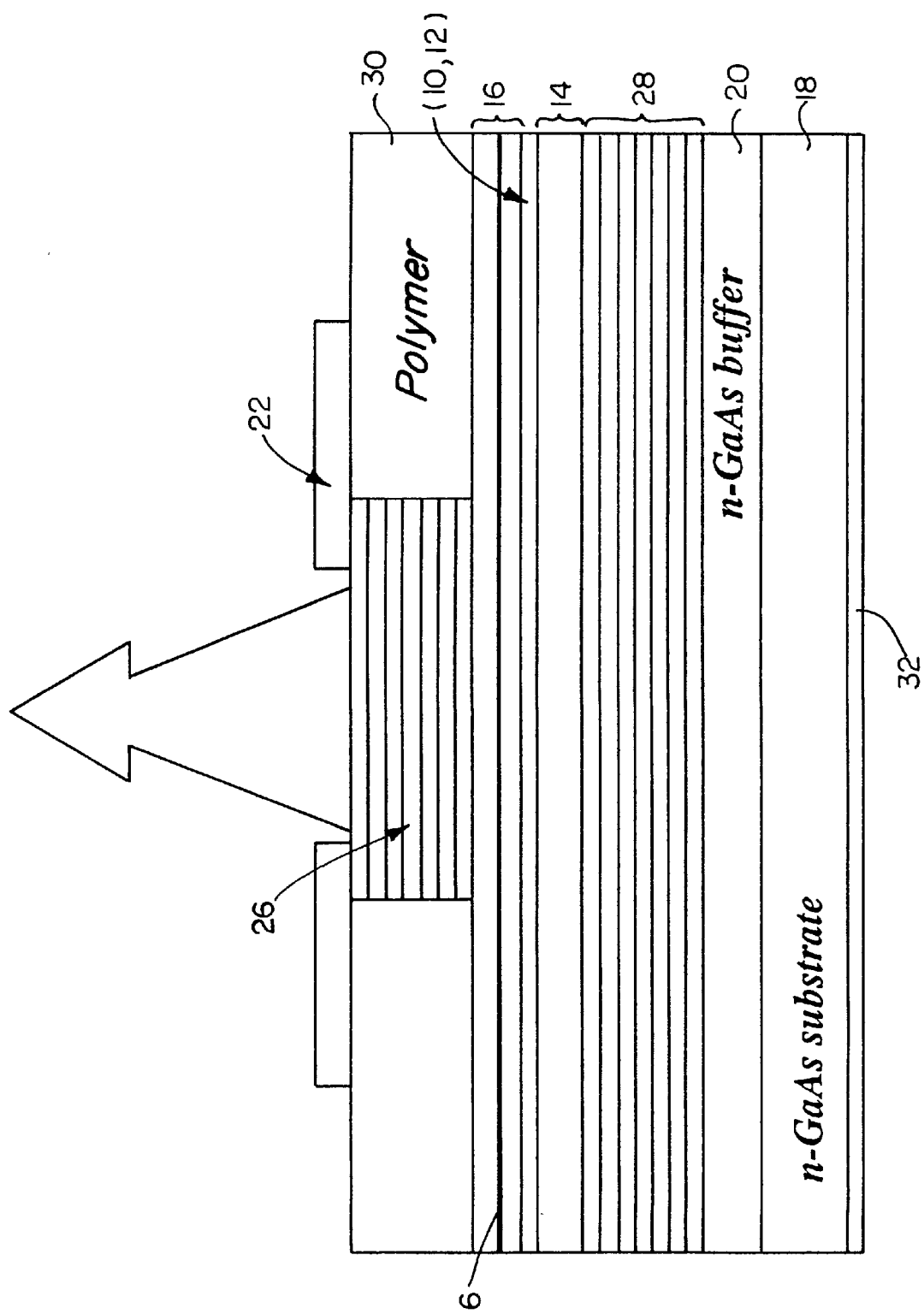
Figure 14:
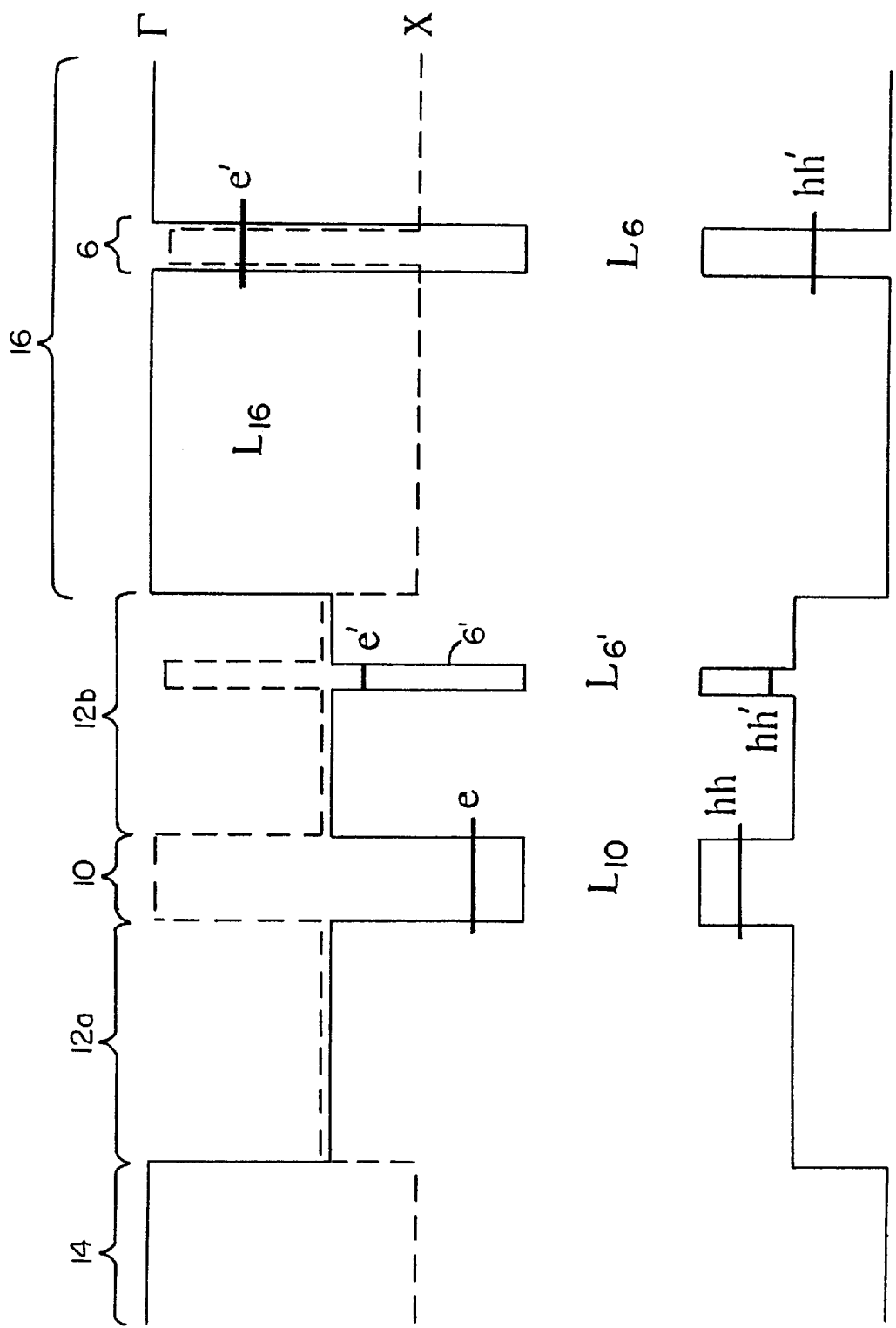
Figure 15:
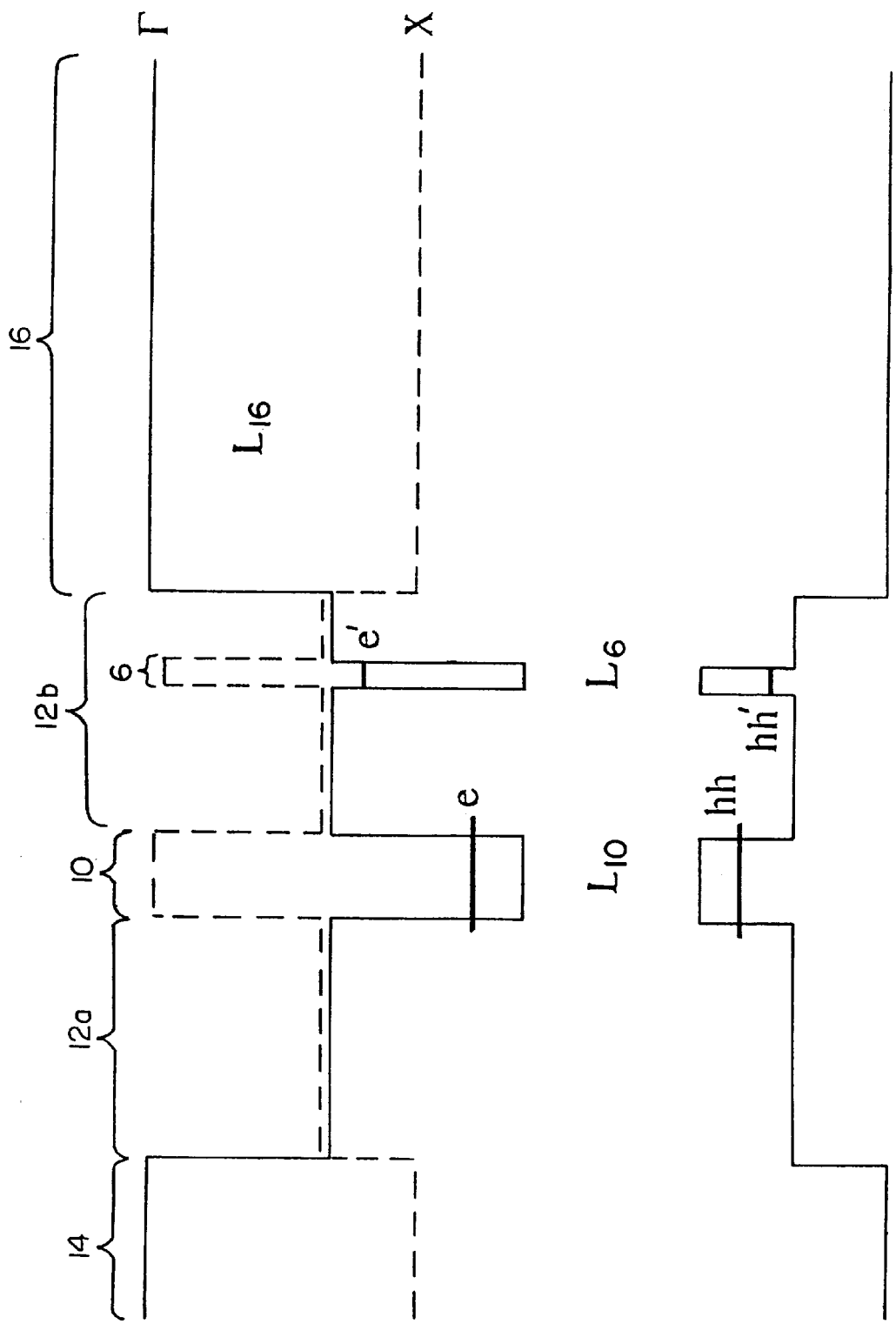

Embodiments of the present invention will now be described, by way of example, with reference to the accompanying drawings, in which:

FIG. 1 is a schematic diagram of the conduction and valence band energies of the known SCH laser device discussed hereinabove, FIG. 2(a) is a schematic diagram of the conduction band energy of the known SCH laser device provided with an MQB region of the type discussed hereinabove, FIG. 2(b) shows the reflectivity of the laser device of FIG. 2(a), FIG. 3 is schematic diagram indicating the relative positions of the conduction and valence band edges for the (InGa)P/(Al$_y$Ga$_{1-y}$)$_{0.515}$In$_{0.485}$P alloy system, FIG. 4 is a schematic illustration showing the conduction band edge position in a typical (InGa)P/(AlGaIn)P visible laser diode, FIG. 5 is a schematic illustration of the active region and adjacent regions of a typical conventional (InGa)F/(AlGaIn)P visible laser diode, FIG. 6 is a schematic illustration of the active region of a (InGa)P/(AlGaIn)P visible laser diode where a single electron reflecting barrier layer has been added in accordance with the present invention, FIG. 7 is a schematic illustration similar to that of FIG. 6, but for a GRINSCH-type laser diode, FIGS. 8 and 9 are schematic illustrations similar to that of FIG. 6, but with more than one electron reflecting barrier layer, FIG. 10 is a graph showing an experimental comparison of threshold current densities of (AlGaIn)P LCDs with and without barrier layers, FIG. 11 is a diagram similar to that of FIG. 3 but showing the relative positions of the conduction and valence band edges for the GaAs/(Al$_x$Ga$_{1-x}$)As alloy system, FIG. 12 is a schematic perspective view (not to scale) of the layer structure of an (AlGaIn)P edge emitting LD according to the present invention, FIG. 13 is a schematic sectional view of the layer structure of an (AlGaIn)P vertical cavity surface emitting laser (VCSEL) device according to the present invention, FIG. 14 is a schematic illustration similar to that of FIG. 6, but showing an additional electron-reflecting barrier layer in the p-side optical guiding region, and FIG. 15 is a schematic illustration similar to that of FIG. 6, but showing the electron-reflecting barrier layer in the p-side optical guiding region rather than in the p-type cladding region.

Referring now to FIG. 6, in a particular example of the invention, a barrier layer 6 of lattice-matched (InGa)P of thickness L$_6$ is inserted in an undoped portion of the p-type cladding region 16 as shown schematically. Also shown are the pertinent conduction and valence band edges. The thickness L$_6$ is chosen to be a value such that the first confined electron state (e') lies above that of the X-minima in the cladding and guiding regions 12b and 16. With e' in this energy position, it does not provide a state of lower energy, into which electrons could thermalise and subsequently recombine. Thus, e' effectively defines the Γ-minimum in the barrier layer 6. If the barrier layer 6 consists of (InGa)P lattice-matched to GaAs, for example, then an appropriate value of L$_6$, would be 15 Å, or less. It is still possible for carriers in the X-valley of the cladding region 16 to escape by two routes: (1) thermal escape from the cladding region 16 over the top of the barrier presented by the confined level e' or (2) tunnelling through the barrier layer 6, again with the barrier height being e'. The barrier height is governed by e' and not the X-minimum in the (InGa)P due to the Γ-X wavefunction mixing which occurs at the heterojunction interface. Mechanisms (1) and (2) above will be minimised if the carriers in the cladding region 16 have thermalised to the bottom of the X-band, where there will be the maximum barrier to surmount and the maximum barrier to tunnel through. The thickness L$_{16}$ of the cladding region 16 should ideally be adjusted to arrange such a situation. A thickness L$_{16}$ of >100 Å is considered to be of assistance in this respect.

In FIG. 7, barrier layer 6 is situated on the p-side of active region 10 of a laser diode of the type known as a Graded Refractive Index Separate Confinement Heterostructure (GRINSCH). Here the energy gap of each of the optical guiding regions 12a and 12b is varied in a graded manner from the respective cladding regions 14 and 16 to the SQW or MQW active region 10 of the heterostructure. This grading may not necessarily be linear as shown in FIG. 7.

In all the following embodiments, the laser diode design can equally well be the type shown in FIG. 6 or in FIG. 7.

In FIGS. 8 and 9, the single barrier layer 6 is replaced by two (see FIG. 8) or three (see FIG. 9) barrier layers 6a, 6b etc, with adjacent barrier layers being separated by a layer 7a etc of quaternary cladding material (AlGaIn)P. In this case, the thicknesses of such barrier layers 6a, 6b etc within the p-type cladding region 16 are chosen to decrease progressively away from guiding region 12b. This would then provide a rising staircase of e' levels to present an increasing tunnel barrier to electrons. Typical thicknesses might be 12 Å, 7 Å and 5 Å for a three barrier layer construction as in FIG. 9.

Alternatively, the value of L$_6$ can be chosen such that the first confined state provides a state into which electrons could become trapped. However, in this situation, it is possible that these electrons could recombine with holes trapped on the p-side, thus providing another loss mechanism. In either case, the thickness L$_6$ of the barrier layer 6 should ideally be chosen so as to minimise the tunnelling of electrons in the X-valleys through the (InGa)P layer.

In another embodiment of the invention, the barrier layer 6 is made of the quaternary alloy (Al$_y$Ca$_{1-y}$)$_{0.515}$In$_{0.485}$P. If the value of y is chosen to be 0.5, then the band edge profile in layer looks like that of the guiding layer 12b.

If a "bulk" layer is inserted, then the lowest state in the barrier region 6 becomes the Γ-point in the Brillouin zone, which still presents a barrier to tunnelling and thermionic emission. Thinner layers would increase the confinement of the Γ-electrons but would not alter the position of the X-bands, which would then present the lowest barrier to escape. A compromise is to use a value of y between 0 and 0.5. It is then necessary to rely on quantum confinement effects on the Γ-electrons to raise the potential barrier to tunnelling.

In another embodiment of the invention, the barrier layer 6 is made from a non-lattice matched $In_zGa_{1-z}P$ alloy, the value of z being chosen so that the (InGa)P is under tensile strain when grown epitaxially on a GaAs substrate. In practice, this means using values of z<0.48. Once again, quantum confinement effect would need to be used to raise the Γ-point in the Brillouin zone above the X-point in the Brillouin zone in the guiding region 12b. In this case, however, due to the increased gap of the barrier layer 6, the thickness could be somewhat greater than 15 Å.

Referring now to FIG. 10, there are shown the room temperature threshold current densities of so-called Broad Area laser diodes (LD) operating under pulsed electrical injection. These are terms that would be familiar to anyone skilled in the production and testing of laser diode devices. Illustrated are results on a so-called "Control" LD similar to that shown in FIG. 5. The LD has been produced using an epitaxial growth technique known as Gas Source Molecular Beam Epitaxy (GSMBE), but it could have been fabricated using an alternative such as solid source molecular beam epitaxy (SSMBE) or metal-organic chemical vapour deposition (MOCVD or MOVPE or OMVPE). In the Control LD, the p-type cladding region 16 is fabricated from the quaternary alloy $(Al_{0.7}Ga_{0.3})_{0.515}In_{0.405}P$ and is doped with Be atoms to a value of $\sim 10^{18} cm^3$, whilst the n-type cladding region 14 is made from the same alloy composition but doped with Si atoms to value of $\sim 10^{18} cm^{-3}$. The optical guiding regions 12a and 12b following the cladding regions 14 and 16 are approximately 500 Å thick, made from the quaternary alloy $(Al_{0.5}Ga_{0.5})_{0.515}In_{0.485}P$ and are not intentionally doped with any impurity atoms. Between these two guiding regions 12a and 12b is sandwiched three quantum wells of composition $Ga_{0.51}In_{0.485}P$ of ~100 Å thickness separated by ~50 Å barriers of $(Al_{0.5}Ga_{0.5})_{0.515}In_{0.485}P$. These wells and barriers define the active region 10 and are similarly not intentionally doped with impurity atoms.

The Single Reflector LD (i.e. the one having a single barrier layer 6) is identical in structure to the Control apart from the addition in the p-type cladding region of a ~12 Å thick layer of $Ga_{0.515}In_{0.485}P'$ situated some ~300 Å from the beginning of the guiding region 12b. The Double Reflector LD is identical to the Single Reflector LD save for the addition of a further layer of $Ga_{0.515}In_{0.485}P$ some ~7 Å thick separated some 12 Å from it by a $(Al_{0.7}Ga_{0.3})_{0.515}In_{0.485}P$ layer. One skilled in the art of designing and fabricating semiconductor laser diodes will appreciate that various substitutions of layer thicknesses and composition can be made within the context of the invention and, as such, the LDs in these experiments should not be construed to be the only possibilities.

As will be apparent from FIG. 10, the LDs with the barrier layer(s) in accordance with the present invention have brought about a >30% decrease in the threshold current density of the laser diodes.

In FIG. 11, there is shown that the principle illustrated for the (InGa)P/(AlGaIn)P system is also applicable to the GaAs/(AlGa)As system. Since this is also one where the relative energetic positions of the Γ and X-bands, when coupled with the band offset ratio between GaAs and (AlGa)As, means that it is possible to construct heterostructures where the X-band in the guiding region and/or the cladding region on the p-side of the heterostructure is the lowest energy state.

Referring now to FIG. 12, the edge-emitting LD illustrated therein comprises a layer structure comprising (InGa)P layer 10 defining the quantum well active region, undoped (AlGaIn)P layers 12a and 12b, respectively, defining the n-side and p-side optical guiding regions, n-doped (AlGaIn)P layer 14 defining the n-type cladding region, p-doped (AlGaIn)P layer 16 defining the p-type cladding region, and (InGa)P layer 6 defining the electron-reflecting barrier. The functions served by such layers will be readily apparent from the previous description. These layers are epitaxially grown on an n-doped GaAs substrate 18 having an n-doped GaAs buffer layer 20 thereon in a manner which will be well understood by those skilled in the art. A p-doped GaAs contact layer 21 is provided on top of the layer 16. A p-side metal contact 22 and an n-side metal contact 32 are provided, respectively, on top of the layer 21 and on the underside of the substrate 18. Laser mirror facets 24 are formed by cleaved edges perpendicular to the plane of the substrate 18.

The edge-emitting LD of FIG. 12 operates in a manner which will be well understood by those skilled in the art having regard to the preceding description so that, in use, edge emission of light takes place in the direction of the arrow illustrated in FIG. 12.

The VCSEL device of FIG. 13 is formed on n-doped GaAs substrate 18 having n-doped GaAs buffer layer 20 thereon, by epitaxially depositing and etching as necessary in a manner well known in the art. In FIG. 13, quantum well active region 10 and the optical guiding region 12 are illustrated for convenience as a single layer, but in practice the various regions 12a, 10 and 12b (as described previously) are grown in sequence. The guiding regions 12a and 12b are undoped. N-doped (AlGaIn)P layer 14 defines an n-doped spacer region which forms part of the cladding of the VCSEL. P-doped (AlGaIn)P layer 16 defines a p-doped spacer region which also forms part of the cladding of the VCSEL Upper and lower p-type and n-type Bragg Reflectors (DBRs) 26 and 28 are also provided in the layer structure in a manner well known per se in the art. The upper DBR 26 is surrounded by an annular, electrically insulating polymer current-confining layer 30. Annular p-type upper contact 22 is provided above the DBR 26 and the layer 30. An n-type contact 32 is provided on the underside of the substrate 18.

As is well known with VCSELs, light emission occurs through central aperture in the annular upper contact 22 in the direction indicated by the arrow in FIG. 13.

Referring now to FIG. 14, the arrangement is as described above in relation to FIG. 6 except that a further electron-reflecting barrier layer 6' of identical composition to that of the barrier layer 6 is provided in the p-side guiding region 12b near to the p-type cladding region 16. The barrier layer 6' has a thickness of 5 to 10 Å (although it may have a thickness between 5 and 50 Å). The arrangement is such that the first confined electron energy level e' in the barrier layer 6' is near to the Γ-minimum in the adjacent parts of the guiding region 12b on opposite sides of the layer 6'. As can be seen from FIG. 14, e' in the layer 6' is higher than e in the active region 10.

Referring now to FIG. 15, the arrangement is as described above in relation to FIG. 5 except that the electron-reflecting barrier layer 6 is provided in the p-side guiding region 12b near to the p-type cladding region 16 rather than in the p-type cladding region 16 itself. The barrier layer 6 has a thickness of 5 to 10 Å (although it may have a thickness between 5 and 50 Å). The arrangement is such that the first confined electron energy level e' in the barrier layer 6 is near to the Γ-minimum in the adjacent parts of the guiding region 12b on opposite sides of the layer 6. As can be seen from FIG. 15, e' in the layer 6 is higher than e in the active region 10.

One skilled in the art of semiconductor physics and electronic materials will appreciate that the effect described here is not limited to the two alloy systems described above but is applicable to any heterostructure LD whose constituents have a conduction band dependence similar to that shown in FIGS. 11 and 3, and preferably those where (i) in the active region, the Γ-band is the lowest energy state, (ii) in the active region, the X-band has a higher energy state than the Γ-band in the optical guiding region on the n-side of the device, (iii) in the optical guiding region on the p-side of the LD, the X-band is either the lowest energy state or is close to the Γ-band which is the lowest energy state, and (iv) in the n-type cladding region and/or the p-type cladding region, the X-band is the lowest energy state.

What is claimed is:

1. A separate confinement heterostructure laser device, comprising:
   an optical guiding region;
   an active region provided in the optical guiding region; and
   n-type and p-type cladding regions provided on opposite sides of the optical guiding region,
   wherein a first electron-reflecting barrier layer is provided in a p-side region of the laser device,
   a composition of the first electron-reflecting barrier layer is set in such a manner that the first electron-reflecting barrier layer has an X-minimum which is higher than that in an adjacent portion of the p-side region at least on one selected side of the first electron-reflecting barrier layer, the selected side being disposed between the first electron-reflecting barrier layer and the active region, and
   electron tunneling between X-bands of adjacent portions of the p-side region on opposite sides of the first electron-reflecting barrier layer is prevented by satisfying at least one of a first condition and a second condition, the first condition being such that a thickness of the first electron-reflecting barrier layer is set at a sufficient value for preventing the electron tunneling, and the second condition being such that parts of the p-side region on the opposite sides of the first electron-reflecting barrier layer have compositions which are sufficiently different from one another for preventing the electron tunneling.

2. A laser device according to claim 1, wherein the first electron-reflecting barrier layer is provided in the p-type cladding region.

3. A laser device according to claim 2, wherein:
   the composition of the first electron-reflecting barrier layer is set in such a manner that the X-minimum of the first electron-reflecting barrier layer is higher than that in an adjacent portion of the p-type cladding region at least on a predetermined side of the first electron-reflecting barrier layer, the predetermined side being disposed between the first electron-reflecting barrier layer and the optical guiding region;
   one of the composition and the thickness of the first electron-reflecting barrier layer is set in such a manner that the first electron-reflecting barrier layer has a Γ-minimum which is higher than the X-minimum of the adjacent portion of the p-type cladding region; and
   electron tunneling between X-bands of adjacent portions of the p-type cladding region on the opposite sides of the first electron-reflecting barrier layer is prevented by satisfying at least one of condition (a) and condition (b), the condition (a) being such that the thickness of the first electron-reflecting barrier layer is set at a sufficient value for preventing the electron tunneling, and the condition (b) being such that the adjacent portions of the p-type cladding region on the opposite sides of the first electron-reflecting barrier layer have compositions which are sufficiently different from one another for preventing the electron tunneling.

4. A laser device according to claim 2, wherein:
   the composition of the first electron-reflecting barrier layer is set in such a manner that the X-minimum of the first electron-reflecting barrier layer is higher than that in adjacent portions of the p-type cladding region on both sides of the first electron-reflecting barrier layer;
   one of the composition and the thickness of the first electron-reflecting barrier layer is set in such a manner that the first electron-reflecting barrier layer has a Γ-minimum which is higher than the X-minima of the adjacent portions of the p-type cladding region on the both sides of the first electron-reflecting barrier layer; and
   electron tunneling between X-bands of the adjacent portions of the p-type cladding region on the opposite sides of the first electron-reflecting barrier layer is prevented by satisfying at least one of condition (a) and condition (b), the condition (a) being such that the thickness of the first electron-reflecting barrier layer is set at a sufficient value for preventing the electron tunneling, and the condition (b) being such that the adjacent portions of the p-type cladding region on the opposite sides of the first electron-reflecting barrier layer have compositions which are sufficiently different from one another for preventing the electron tunneling.

5. A laser device according to claim 2, wherein a thickness of a part of the p-type cladding region disposed between the first electron-reflecting barrier layer and the optical guiding region is not less than 100 Å.

6. A laser device according to claim 2, wherein a thickness of a part of the p-type cladding region disposed between the first electron-reflecting barrier layer and the optical guiding region is in the range from 100 Å to 1 μm.

7. A laser device according to claim 2, wherein the thickness of the first electron-reflecting barrier layer is 20 Å to 3 Å.

8. A laser device according to claim 7, wherein the thickness of the first electron-reflecting barrier layer is 15 Å to 7 Å.

9. A laser device according to claim 2, wherein the thickness of the first electron-reflecting barrier layer is set in such a manner that a first confined electron state therein lies above that of the X-minima in adjacent parts of the cladding region and the optical guiding region.

10. A laser device according to claim 1, wherein the first electron-reflecting barrier layer is provided in a p-side portion of the optical guiding region.

11. A laser device according to claim 10, wherein the thickness of the first electron-reflecting barrier layer is 5 Å to 50 Å.

12. A laser device according to claim 10, wherein the thickness of the first electron-reflecting barrier layer is 5 Å to 10 Å.

13. A laser device according to claim 1, wherein the first electron-reflecting barrier layer has substantially the same composition as that of the active region.

14. A laser device according to claim 1, wherein at least one additional electron-reflecting barrier layer is further provided in the p-side region of the laser device.

15. A laser device according to claim 14, wherein the at least one additional electron-reflecting barrier layer is provided in the same portion of the p-side region of the laser device as that in which the first electron-reflecting barrier layer is provided.

16. A laser device according to claim 14, wherein the at least one additional electron-reflecting barrier layer is provided in a different portion of the p-side region of the laser device from that in which the first electron-reflecting barrier layer is provided.

17. A laser device according to claim 14, wherein thicknesses of the at least one additional electron-reflecting barrier layer and the first electron-reflecting barrier layer are set so as to decrease in a direction away from the active region.

18. A laser device according to claim 14, wherein a separation region separating adjacent two of the electron-reflecting barrier layers is not less than 2.85 Å.

19. A laser device according to claim 18, wherein the separation region is in the range from 7 Å to 15 Å.

20. A laser device according to claim 1, wherein the laser device is provided based on an alloy system of GaInP/(AlGaIn)P.

21. A laser device according to claim 20, wherein the alloy system is represented as $(In_xGa_{1-x})P/(Al_yGa_{1-y})_zIn_{1-z}P$, where $0.3 \leq x \leq 0.6$, y is in the range from 0 to 1, and z is in the range from 0.3 to 0.6.

22. A laser device according to claim 21, wherein a value of z is selected to ensure that the alloy system of $(AlGa)_zIn_{1-z}P$ has the same lattice constant as GaAs.

23. A laser device according to claim 21, wherein a value of z is 0.515.

24. A laser device according to claim 1, wherein the laser device is provided based on an alloy system of AlGaAs.

25. A laser device according to claim 24, wherein the alloy system is represented as $GaAs/(Al_xGa_{1-x})As$, where x is in the range from 0 to 1.

26. A laser device according to claim 1, wherein the laser device is of a Graded Refractive Index Separate Confinement Heterostructure type.

27. A laser device according to claim 1, wherein the laser device is of an edge-emitting type.

28. A laser device according to claim 1, wherein the laser device is of a surface-emitting type.

* * * * *